(12) United States Patent
Pant et al.

(10) Patent No.: US 9,973,187 B1
(45) Date of Patent: May 15, 2018

(54) CIRCUITS AND METHODS PROVIDING POWER ON RESET SIGNALS

(71) Applicant: QUALCOMM INCORPORATED, San Diego, CA (US)

(72) Inventors: Harshat Pant, San Diego, CA (US); Aditya Vummannagari, San Clemente, CA (US); Yeshwant Kolla, Wake Forest, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/381,322

(22) Filed: Dec. 16, 2016

(51) Int. Cl.
*H03L 7/00* (2006.01)
*H03K 17/22* (2006.01)
*H03K 3/037* (2006.01)

(52) U.S. Cl.
CPC ............ *H03K 17/223* (2013.01); *H03K 3/037* (2013.01)

(58) Field of Classification Search
CPC .................................................... H03K 17/223
See application file for complete search history.

(56) References Cited

U.S. PATENT DOCUMENTS

| | | |
|---|---|---|
| 6,914,462 B2 | 7/2005 | Kim et al. |
| 7,307,454 B1 | 12/2007 | Wert |
| 7,432,748 B2 | 10/2008 | Khan et al. |
| 8,106,688 B2 | 1/2012 | Huang et al. |
| 2006/0103437 A1* | 5/2006 | Kang ................... H03K 17/223 327/143 |
| 2016/0085279 A1 | 3/2016 | Culshaw et al. |

\* cited by examiner

*Primary Examiner* — Daniel Puentes
(74) *Attorney, Agent, or Firm* — Haynes and Boone, LLP (57) ABSTRACT

A power on reset circuit including an inverter powered by a first power domain, the inverter including a data input coupled to a power rail of a second power domain; logic circuitry coupled with an output of the inverter, the logic circuitry having a control signal output; and wherein, during a power up operation, the first power domain powers up before the second power domain powers up. Upon power up of the first power domain, the inverter can output a high signal to the logic circuitry and output a low signal to the logic circuitry in response to power up of the second power domain. The logic circuitry is further configured to output a first value for a control signal in response to the first power domain powering up and configured to output a second value for the control signal in response to the second power domain powering up.

21 Claims, 7 Drawing Sheets

CIRCUITS AND METHODS PROVIDING POWER ON RESET SIGNALS

TECHNICAL FIELD

The present application relates, generally, to power on reset circuits and methods and, more specifically, to providing power on reset signals for systems having multiple power domains.

BACKGROUND

Conventional power on reset circuitry is used to ensure that memory and logic circuits are in known states at power up. However, the use of multiple power rails in some designs complicates power on reset techniques. Take, for example, a system that has three power rails—MX, CX, PX. When the system is powered up, the MX power rail comes up first, followed by CX, and lastly PX.

Today's complex systems on chip (SoCs) have started using power generation structures such as power multiplexors (muxes) that can provide the option of flipping the power supply of downstream logic to one supply during normal operation and another supply for special conditions such as high performance modes or deep sleep modes. For example, one system may use power muxes to provide power to a retention rail of retention flip-flops. In normal operational mode, power mux supplies VDD_CX and in deep sleep mode, when CX is collapsed, the mux switches to VDD_MX in order to keep the data retained in flops.

Continuing with the example, a controller that controls the signals to the power mux operates on the MX power domain, but there is no reset generated in the system when only MX has come up but the other power domains have not yet come up. Reset is typically generated much later once other power rails are up. However, if the controller is not reset at the moment when MX turns on or if the control signals to the power mux are not clamped to a proper value when MX turns up, the control signals could cause the power mux to go to an unknown state, potentially causing a short between VDD_CX and VDD_MX.

Thus, there is a need in the art for a circuit that can create stable clamp and reset signals at the start from within the SoC that will allow known signals to be fed into the power mux during a period when the first power domain has come up but other power domains have not yet come up.

SUMMARY

Various embodiments are directed to circuits and methods that provide power on reset signals in a system having multiple power domains. Specifically, various embodiments are directed to circuits and methods that provide power on reset signals during a time period when a first power domain has come up but additional power domains have yet to come up. In one example, a power on reset circuit includes: an inverter powered by a first power domain, the inverter including a data input coupled to a power rail of a second power domain; logic circuitry coupled with an output of the inverter, the logic circuitry having a control signal output; and wherein, during a power up operation, the first power domain powers up before the second power domain powers up, and wherein upon power up of the first power domain the inverter is configured to output a high signal to the logic circuitry and to output a low signal to the logic circuitry in response to power up of the second power domain, wherein the logic circuitry is configured to output a first value for a control signal in response to the first power domain powering up and configured to output a second value for the control signal in response to the second power domain powering up and after a delay.

According to one embodiment, a method performed in a processing device having a first power domain and a second power domain, the method includes: during a first time period when the first power domain has come up and the second power domain has not yet come up, receiving a digital zero value from a power rail of the second power domain at a data input of an inverter of a power on reset circuit, wherein the power on reset circuit is powered by the first power domain; asserting a power on reset signal in response to receiving the digital zero value at the data input of the inverter; during a second time period after both the first power domain and the second power domain have come up, receiving a digital one value at the data input of the inverter; and de-asserting the power on reset signal in response to receiving the digital one value at the data input of the inverter and subsequent to a delay.

According to another embodiment, a power on reset circuit includes: an inverter configured to receive power from a first power domain and coupled at a data input to a power rail of a second power domain; means for receiving an output from the inverter and applying a digital one value to a first input of an OR gate in response to receiving the output from the inverter; means for receiving a digital value from the second power domain and shifting the digital value according to a clock from the second power domain to apply a digital zero to the first input of the OR gate; and means for applying a reset signal from the second power domain to the second input of the OR gate.

According to another embodiment, a power on reset circuit includes: an inverter configured to receive power from a first power domain and coupled at a data input to a power rail of a second power domain; means for receiving an output from the inverter at a first one of either a set input or a reset input and asserting a power on reset signal to a plurality of clamps in response to receiving the output from the inverter; and means for applying a delay to the output of the inverter, wherein the means for applying delay is coupled between the output of the inverter and a second one of either the set input or the reset input.

DETAILED DESCRIPTION

Various embodiments provided herein include systems and methods to provide power on reset signals in systems having multiple power domains, wherein the power domains come up at different times. For instance, in a system having a first power domain that comes up first and a second power domain that comes up later (e.g., after a few microseconds or milliseconds) circuits and methods described herein are configured to provide a power on reset signal during a period of time after the first power domain has come up but the second power domain has not yet come up.

An example embodiment includes a semiconductor chip with the first power domain and the second power domain and at least one power multiplexor (power mux) that selects between each of the two power domains at a power rail. In one example, the power multiplexor may select one of the two power domains to power a retention power rail or other power rail. The power multiplexor is controlled by one or more control signals to select one of the two power domains, and the one or more control signals are produced by a power multiplexor control circuit.

Continuing with this example, during power up of the semiconductor chip, the first power rail comes up to its operating voltage value and there is a time period before the second power rail comes up to its operating voltage value. During this time period, a power on reset circuit includes a logic gate, such as an inverter, that receives power from the first power domain and has a data input coupled to a power rail of the second power domain. In this example, the power rail of the second power domain is at a logic zero, rather than as floating, so that the data input to the logic gate is a logic zero. Such configuration of the power on reset circuit allows downstream logic circuitry, which is also powered by the first power domain, to generate one or more control signals having known states even before the second power domain has come up.

An example of a power on reset circuit includes a power inverter coupled to a power rail of the second power domain at its data input and providing its output to either a set or reset input of a flip-flop, where the other of the set or reset input is coupled to the inverter by a delay unit. When the second power domain is low, its power rail is at a logic zero, and the power on reset circuit outputs a control signal having a known value. When the second power domain comes up to its operating voltage (a logic one value) the output of the inverter changes and causes an output of the flip-flop to change via the delay unit. Thus, such example power on reset circuit de-asserts its control signal after the second domain comes up and after the delay that is defined by the delay unit.

Another example of a power on reset circuit includes a power inverter coupled to a power rail of the second power domain at its data input, wherein the output of the power inverter forces a downstream logic gate (e.g., an OR gate) to a known value when the first power domain has come up but the second power domain has yet to come up. After the second power domain comes up the output of the inverter changes, and a series of flip-flops or other synchronizer circuit shifts a digital value to the downstream logic gate after multiple clock cycles. Thus, such example power on reset circuit de-asserts its control signal after the second power domain comes up and after a delay defined by clock cycles. The output of the downstream logic gate may then be controlled by another input generated from the second power domain.

The example power on reset circuits above may produce a control signal having a known value for any appropriate use. For instance, in one embodiment, an output of the power on reset circuit may be used to set logic gates to known, initial values. In another example, the output of the power on reset circuit may be used to clamp input signals to known, initial values. Furthermore, the circuits and methods of the various embodiments may include one or more of the example power on reset circuits. For instance, one example embodiment may include a power on reset circuit to clamp values of input signals after the first power domain comes up but before the second power domain comes up and may include an additional power on reset circuit to force logic gates of a control circuit to known states before the second power domain comes up.

An advantage of some embodiments described above is that they may provide power on reset signals (e.g., clamp signals and reset signals) at an early time during power up of a semiconductor die. For instance, various embodiments provide one or more power on reset signals as soon as the first power domain comes up, thereby preventing unknown states in downstream circuitry, such as power mux control circuits and the like. It should be understood that while the various embodiments may be described as providing power on reset signals contemporaneously with the first power domain coming up, it is understood that switching times of transistors may provide some delay between the first power domain coming up and the power on reset signal achieving its known state. However, such delay is functionally negligible when compared to the amount of time that elapses between the first power domain coming up and the second power domain coming up.

Figure 1:
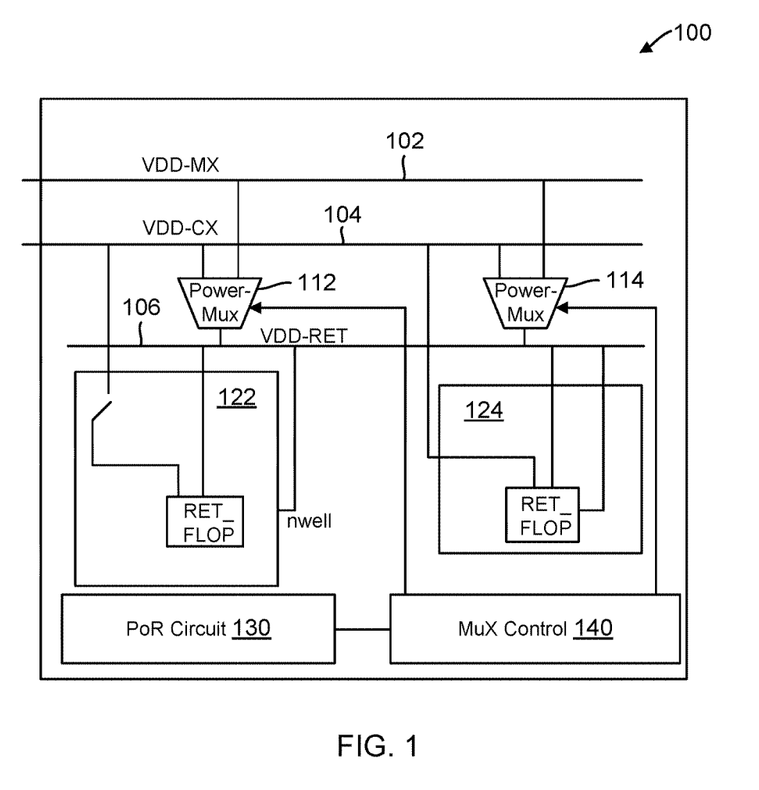
FIG. 1 is an illustration of an example portion of a processing device on a semiconductor chip having multiple power domains, according to various embodiments.

FIG. 1 is a simplified diagram illustrating an example portion 100 of a computing device in which various embodiments may be implemented. For instance, portion 100 may be included in a system on chip (SOC) or other semiconductor processor device that has multiple power domains. An example of a SOC includes a semiconductor chip having multiple processing devices within it, including a graphics processing unit (GPU), a central processing unit (CPU), a modem unit, a camera unit, and the like. In some examples, the SOC may be included within a chip package, mounted on a printed circuit board, and disposed within a portable device, such as a smart phone or tablet computer. However, the scope of embodiments is not limited to a chip implemented within the tablet computer or smart phone, as other applications are possible. Furthermore, the illustration of FIG. 1 omits specifically showing a CPU, GPU, or other processing unit for ease of illustration and focuses, instead, on the power on reset circuitry.

In the example of FIG. 1, two power domains are shown—VDD_MX and VDD_CX (referred to herein as MX and CX). The examples of FIGS. 1-6 refer to three different power domains—MX, CX, and PX, where PX is shown in more detail with respect to FIGS. 3-6. The scope of embodiments is not limited to any specific number of power domains, as three power domains are discussed for convenience here. Other embodiments may include two power domains, four power domains, or any other appropriate number of power domains.

The MX and CX power domains are shown at power rails 102 and 104, respectively. Power muxes 112 and 114 are in communication with power rails 102 and 104 to select one of either CX for MX for use on power rail 106. In this example, power rail 106 (VDD_RET) is used to provide power to memory flip-flops 122 and 124. In normal operation mode, the power muxes 112 and 114 supply power from CX. However, when the SOC is in a deep sleep mode, CX is power collapsed, and a lower voltage configured to retain data in memory may be applied by power domain MX. Mux control circuit 140 is used in this example to control the power muxes 112 and 114, selecting one of either MX for CX to apply at the power rail 106.

Continuing with the example, during a power-up operation, the power domain MX powers up first, whereas the power domain CX may then power up subsequently. Power on reset circuit 130 is configured to output control signals to various logic gates (not shown) of mux control circuit 140 during a time when MX is powered up but the other power domains have yet to power up. This may help to ensure that mux control circuit 140 is in a known state during a power-up operation. With mux control circuit 140 in a known state, mux control circuit 140 can then put power muxes 112 and 114 in known states as well, thereby avoiding the problems that may arise with unknown states of power muxes 112 and 114. An example power on reset circuit that may be implemented as power on reset circuit 130 is described in more detail with respect to FIGS. 3 and 5.

Figure 2:
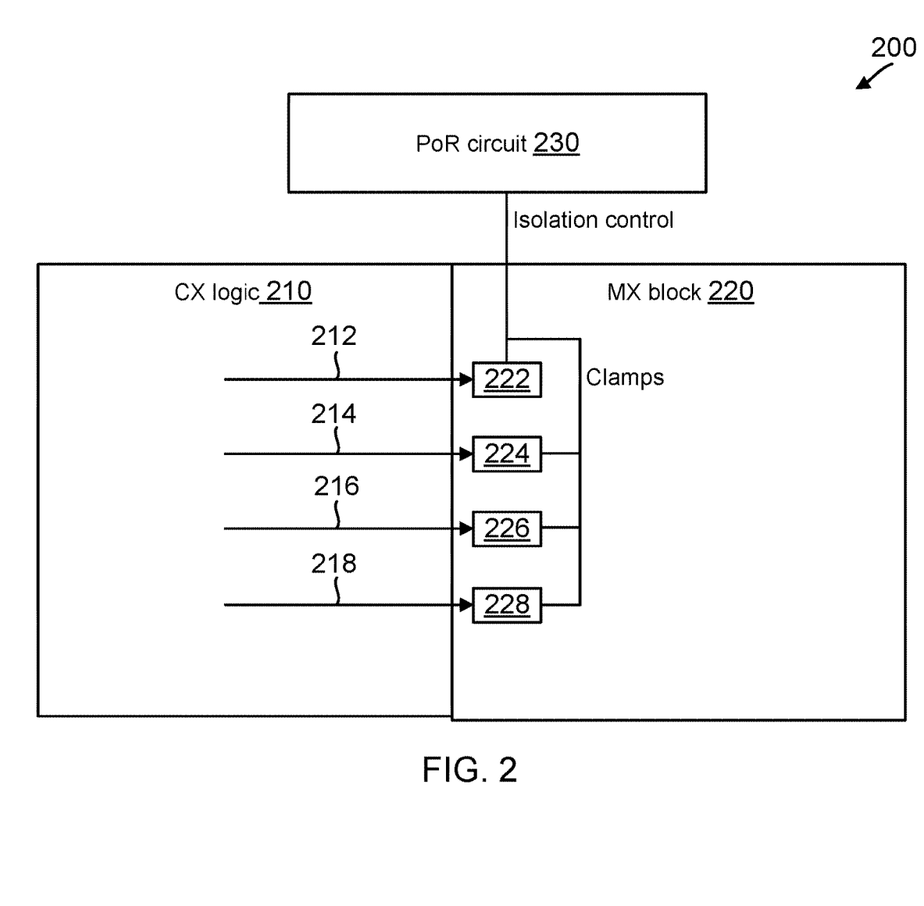
FIG. 2 is an illustration of an example portion of the processing device on a semiconductor chip having multiple power domains, according to one embodiment.

FIG. 2 is a simplified diagram illustrating an example portion 200 of a computing device in which various embodiments may be implemented. For instance, the example portion 200 may be included in an SOC or other semiconductor processor device that has multiple power domains. In this example, CX logic 210 represents a portion of the SOC that is powered by the CX power domain, and MX block 220 represents a portion of the SOC that is powered by the MX power domain. Furthermore, FIG. 2 illustrates a scenario in which signals 212-218 originate within one power domain (e.g., the CX power domain) and are supplied to functional units within another power domain (e.g., the MX power domain).

In the example of FIG. 2, clamps 222-228 are provided to isolate functional units within the MX block 220 from unknown or floating logic states of signals 212-218 during a power-up operation. Specifically, power on reset circuit 230 provides power on reset signals to control clamps 222-228 during a time period when the MX power domain is powered up but other power domains, including the CX power domain, are not yet powered up. The power on reset signals control clamps 222-228 to output known logic states until a time after the other power domains are powered up and signals 212-218 have assumed defined states.

Therefore, power on reset circuit 230 may be used to output one or more pre-defined signals during an early part of a power-up operation in which MX is powered up but the other power domains are not yet powered. An advantage that may be provided by the embodiment of FIG. 2 includes preventing short circuit leakage currents that might otherwise be present as a result of unknown states of signals 212-218. An example circuit that may be implemented as power on reset circuit 230 in various embodiments is discussed in more detail with respect to FIGS. 3 and 6.

Figure 3:
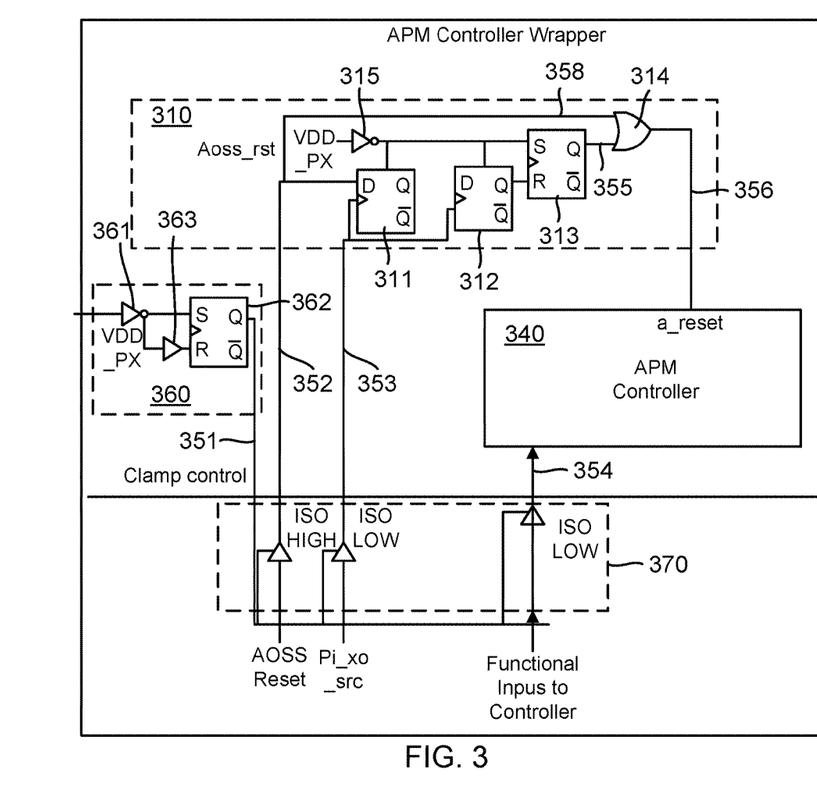
FIG. 3 is an illustration of an example portion of a chip having multiple power domains and to example power on reset circuits, according to one embodiment.

FIG. 3 is a simplified diagram illustrating an example portion 300 of a computing device in which various embodiments may be implemented. As with FIGS. 1 and 2, the illustration of FIG. 3 shows a portion 300 that may be included in an SOC or other semiconductor processor device that has multiple power domains. FIG. 3 is discussed in this example with FIG. 4, which illustrates various timing diagrams for the signals of FIG. 3.

FIG. 3 shows a particular power on reset system having two power on reset circuits 310, 360. Power on reset circuit 310 provides an illustration for adapting the features described above with respect to FIG. 1, whereas power on reset circuit 360 provides an illustration for adapting the features described above with respect to FIG. 2.

Power on reset circuit 310 includes inverter 315, which is powered by power domain MX and receives a signal from power domain PX at its data input. During a power-up operation, the power domain MX powers up first (t1), and the power domain PX powers up last (t2), leaving a period of time when power domain MX is up but PX is not yet up. Furthermore, during that time when PX is not yet up, its power rail is not floating, but is rather held to a logic low or ground-level. For instance, the PX power rail may include additional circuitry (not shown) such as a weak pull-down circuit that holds the power rail at 0V until the PX power domain comes up. This is true for the PX power rail input at inverter 315 as well as at inverter 361. In some examples, the PX power rail will be at 0V before it is powered up and will go up to 1.8V when it is powered up. This 1.8V may be much higher than digital voltage level of MX (e.g., between 0.6 to 1.1V) and hence a high-voltage inverter may be used that can take this 1.8V input and still output a digital 0 when PX is powered up. Thus, if a level of PX is much higher than a level of MX, high-voltage inverter's may be used for inverters 315 and 361.

Figure 4:
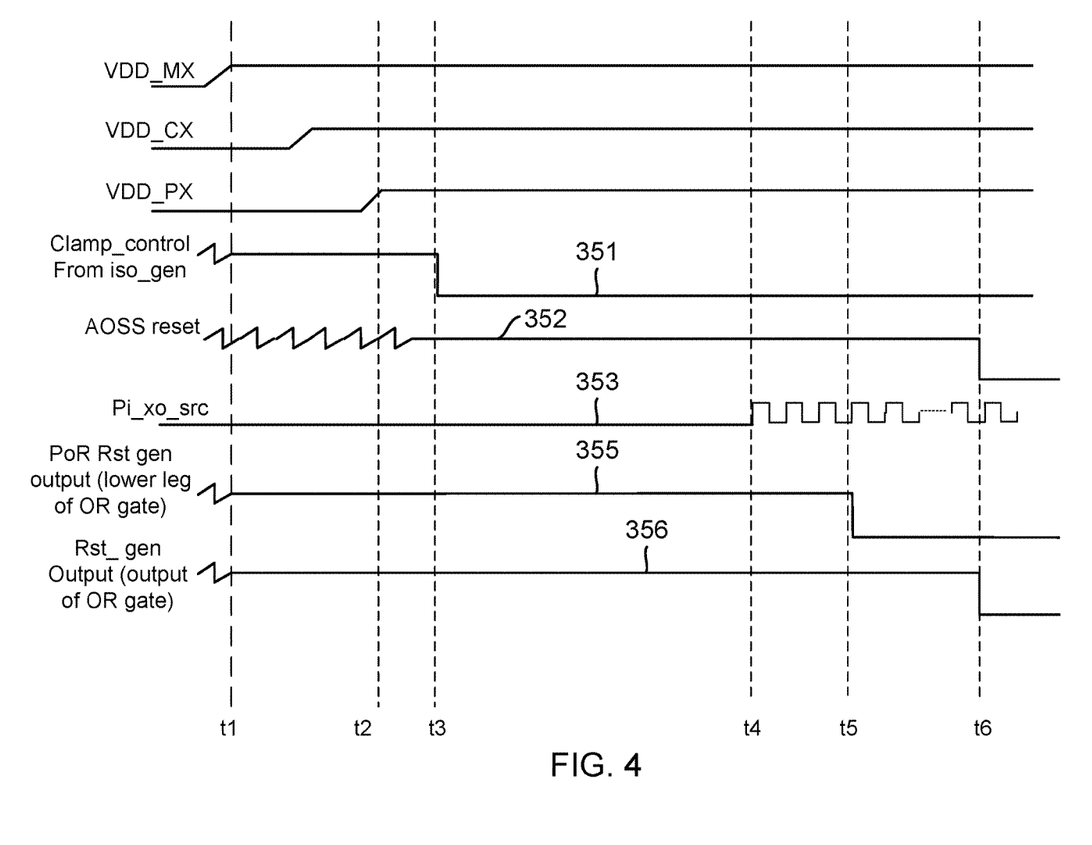
FIG. 4 is a signal timing diagram according to the example embodiments of FIG. 3, according to one embodiment.

An illustration of the timing is provided at FIG. 4, wherein the power domain MX rises from zero to operating voltage (e.g., 1.5 V), and it is followed by power domain CX, which is further followed by power domain PX. At a point in time that power domain MX powers up, the PX input to the inverter 315 is a logic low (digital zero), which causes the output of the inverter 315 to be a logic high (digital one). The digital one at the output of the inverter 315 is provided to the set input of flip-flop 313, which outputs a digital one value to an input of OR gate 314 via signal 355. A digital one at the input of OR gate 314 forces the output signal 356 to a digital one as well. Power mux controller 340 receives signal 356 in a known state—a digital one—as MX goes high even though PX has not yet come up. Signals 355 and 356 are illustrated in FIG. 4 as well.

The digital one output by inverter 315 also goes to reset inputs of flip-flops 311 and 312, thereby causing flip-flops 311 and 312 to output digital zeros, where the digital zero from flip-flop 312 is applied to the reset input of flip-flop 313. The digital zero is neutral to the reset input at flip-flop 313, and thus does not change the output of flip-flop 313.

After some amount of time, as shown in FIG. 4, power domain PX comes up (t2). When power domain PX comes up, it appears as a digital one at the data input of inverter 315, which causes the output of inverter 315 to switch to a digital zero. The digital zero is a neutral signal at the set input of flip-flop 313, so that it does not cause the output of the flip-flop 313 to change. Furthermore, the digital zero is applied to the reset inputs of flip-flops 311 and 312, and does not cause a change of state. Signal 352 goes high after PX goes high, as explained in more detail below, which applies a digital one to the data inputs of flip-flops 311 and 312. Also, after PX goes high, the clock signal 353 turns on (t4), thereby clocking the digital one from flip-flops 311 and 312 to the reset inputs of flip-flop 313. The digital one value applied to the reset input of flip-flop 313 turns the output of flip-flop 313 to a digital zero, which is applied to the input of OR gate 314 via signal 355. Since signal 355 at the input of OR gate 314 is a digital one, the output of the digital OR gate 314 is then controlled by the other input signal 358.

In other words, the power on reset circuit 310 holds the output signal 356 to a known value as soon as MX comes up, and that known value is de-asserted after PX comes up and after a delay passes, wherein that delay is defined by the clock 353 and the flip-flops 311, 312, and 313. This is illustrated in FIG. 4. FIG. 4 is a signal timing diagram according to the example embodiments of FIG. 3.

Figure 5:
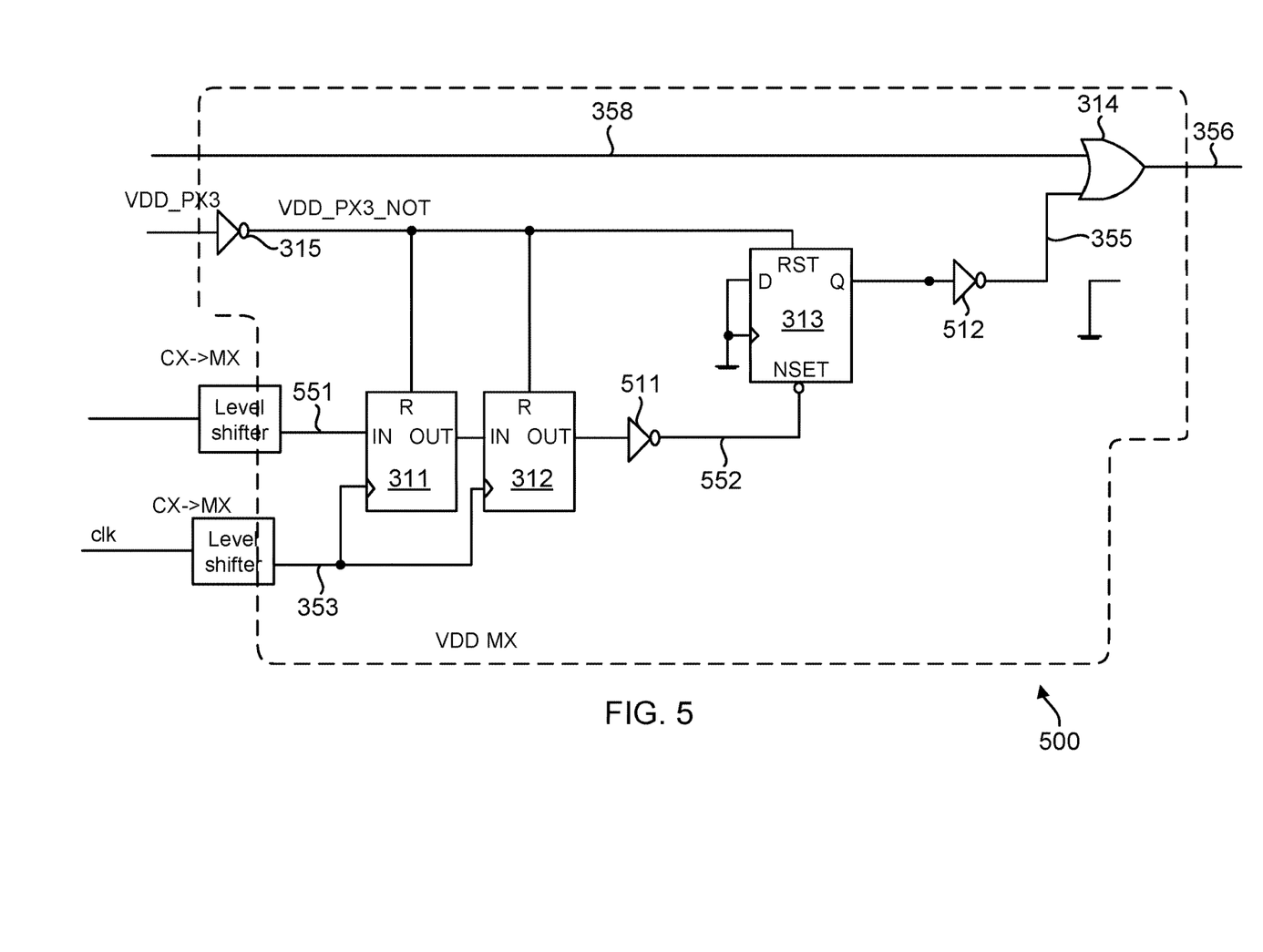
FIG. 5 is an illustration of an example power on reset circuit, according to one embodiment.

FIG. 5 is an illustration of an example power on reset circuit 510, according to one embodiment. Specifically, power on reset circuit 510 is offered to show an example implementation of power on reset circuit 310 in more detail.

In this example, flip-flops 311 and 312 are set-reset flip-flops having set and reset inputs. Beginning at time t1 of FIG. 4, MX is high, but PX has yet to come up. The output of the inverter 315 is a digital one, which resets the synchronizer flip-flops 311 and 312. That causes the flip-flops 311 and 312 to output a digital zero to the inverter 511, and the inverter 511 outputs a digital one to the NSET input of flip-flop 313 via signal 552. A digital one at the NSET input of flip-flop 313 does not reset flip flops 313, as only a digital zero would do that; rather, a digital one is neutral to the NSET input. Flip-flop 313 is reset by the digital one from the inverter 315 so that it outputs a zero to inverter 512. That causes the inverter 512 to output a digital one to the input of the OR gate 314 by signal 355. This digital one at the input of the OR gate 314 forces the output 356 of the OR gate to a digital one.

At time t2 (FIG. 4), power domain PX goes high. The output of the inverter 315 goes low, which is a neutral to the reset inputs of the flip-flops 311 and 312, so flip-flops 311 and 312 continue to output zero until they are toggled by the clock 353. The clock 353 turns on after PX goes high at time t4. The output of the OR gate 314 remains a digital one for the time being. The level of signal 551 is a digital value of one when PX is high, and that digital value gets shifted through the flip-flops 311 and 312 according to the clock 353. The digital one propagates through flip-flops 311 and 312 and causes the output of the inverter 511 to switch to a digital zero, and that zero causes flip-flop 313 to set. When flip-flop 313 sets, its output changes to a digital one, the output of inverter 512 changes to a digital zero, thereby applying a zero to the OR gate 314 at time t5. Once input signal 355 to the OR gate 314 becomes a zero, then the output signal 356 of the OR gate 314 is controlled by signal 358.

In some embodiments, the signal 352 (described in more detail below) may be used as signal 358, so that when signal 352 goes low at time t6, so does the output signal 356. For instance, signal 356 is a stable and known value after MX comes up but before PX comes up, which allows power mux control circuit 340 (FIG. 3) to assume safe and pre-defined states. The other input signal 358 may be used for any appropriate purpose, and may even be used to give control to another reset signal that does not become stable until PX goes high. In this manner, power on reset circuits 310 and 510 provide an early power on reset signal that may be de-asserted, wherein control is left to another signal generated after a subsequent power domain goes high.

Returning to FIG. 3, power on reset circuit 360 provides a signal 351 when MX goes up at time t1. Specifically, inverter 361, delay cell 363, and flip-flop 362 are powered by power rail MX. When MX goes high at time t1, PX is low, and its power rail is at a digital zero, and the power rail is an input to inverter 361. Inverter 361 therefore outputs a digital one to the set input of set-reset flip-flop 362, which forces the signal 351 to a digital one. Signal 351 is an enable signal that controls clamps 370. In this example, each of the clamps 370 forces its output to either a digital one or a digital zero upon receiving a digital one by signal 351. A digital zero on signal 351 turns off the clamps 370, thereby allowing an input signal to pass through a given clamp.

Clamps 370 labeled ISO HIGH force an output signal to digital one when receiving a digital one at signal 351. Clamps 370 labeled ISO LOW force an output signal to a digital zero would receiving a digital one at signal 351. Accordingly, after MX goes high at time t1, signal 352 goes high, 353 goes low, and signal 354 goes low. Signal 354 is shown as a single signal in FIG. 3, though it is understood that signal 354 may include any appropriate number of individual output signals to the various logic gates in power mux controller 340. Furthermore, various embodiments may include ISO HIGH signals applied to logic gates of mux controller 340 in addition to or alternatively to the ISO LOW signal 354.

In one example, the signal 352 is a control signal that is generated by circuitry in the PX power domain and is therefore undefined until after power domain PX comes up. Accordingly, the embodiment of FIG. 3 clamps signal 352 after MX comes up and before PX has come up to provide a predefined and safe value to power on reset circuit 310 between times t1 and t3. At time t2 PX comes up, thereby changing the output of inverter 361 to a digital zero. The digital zero is neutral to the set input of flip-flop 362. The digital zero propagates through delay cells 363 to NRESET input, thereby forcing the output of flip-flop 362 to a digital zero. This digital zero at signal 351 de-asserts the clamps 370. The delay provided by delay cells 363 is illustrated by the elapsed time between times t2 and t3. After time t3, signal 352 is assumed to be in a defined state, rather than floating, and the de-assertion of clamps 370 allows signal 352 to pass through.

Figure 6:
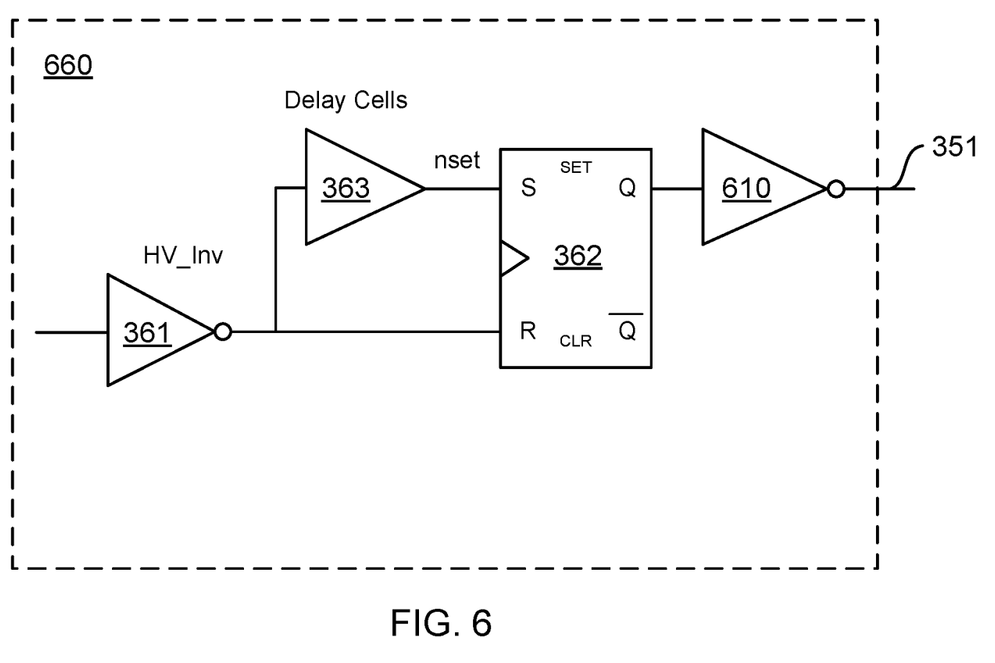
FIG. 6 is an illustration of an example power on reset circuit, according to one embodiment.

FIG. 6 is an illustration of an example power on reset circuit 660, adapted according to one embodiment. FIG. 6 is provides another example configuration for power on reset circuit 360 of FIG. 3. Beginning at time t1, when MX is high and PX is low, the output of inverter 361 is a digital one. This causes a reset at flip-flop 362, which forces the output of flip-flop 362 to a digital zero. Later at time t2, when PX goes high, a digital zero from the inverter 361 is neutral at the reset input, but it propagates through the delay cells 363 and causes a state change at the flip-flop 362 through the NSET input. This forces the output of the flip-flop 362 to a digital one. Inverter 610 keeps the value of output signal 351 at a digital one from time t1 to time t3.

The scope of embodiments includes other uses for the power on reset signals 351 and 356 of FIG. 3. For instance, the signal 351 is used in the embodiment of FIG. 3 as a clamp control signal. However, other embodiments may use a circuit similar to 360 or 660 to provide a power on reset signal applied to logic gates of a controller or other circuit. Similarly, the power on reset signal 356 is applied to logic gates of the mux control circuit 340. However, other embodiments may employ a power on reset signal 356 as a clamp control signal or other appropriate signal. Furthermore, the scope of embodiments is not limited to holding a power mux control circuit to a known state at power-up of a chip. Rather, the scope of embodiments may include applying power on reset signals to any appropriate logical circuit on a semiconductor chip.

Various embodiments may include one or more advantages over conventional systems. For instance, various conventional systems may rely on reset signals that are generated by a power domain that is not the first power domain to come up during a power-up sequence. An example of such a reset signal includes the AOSS reset signal of FIG. 3, which is generated by the PX power domain and is undefined at least until time t3. While relying on such a reset signal may be appropriate in some applications, in other applications the reset signal may take on an expected value due to floating logic gates in the power domain that has not yet come up. An unexpected value may cause short-circuits or other undefined states that have the potential to waste power cause damage to the semiconductor chip.

By contrast, various embodiments described herein provide a power on reset signal during a time when a first power domain has come up and the second power domain has not yet come up. Such embodiments provide for known, safe signals at an early time during a power up process. Such embodiments provide the power on reset signal at the early time by powering logic circuitry of the power on reset signal using the first in time power domain for power and using the second in time power domain as a data input to a logic gate (e.g., a data input to the inverters 315 at 351 of FIG. 3).

An additional advantage is that the power on reset signal an output 351 of FIG. 3 may facilitate the use of a later power on reset signal that is generated by the second in time power domain. For instance, it may be desirable in some instances to generate a reset signal from the second in time power domain, although doing so before the second in time power domain is powered up might create the potential for an undefined state at that reset signal. Various embodiments provide an early power on reset signal that may be used as a clamp control signal to force a known and safe state onto a signal line until the second in time power domain comes up and provides the reset signal.

Figure 7:
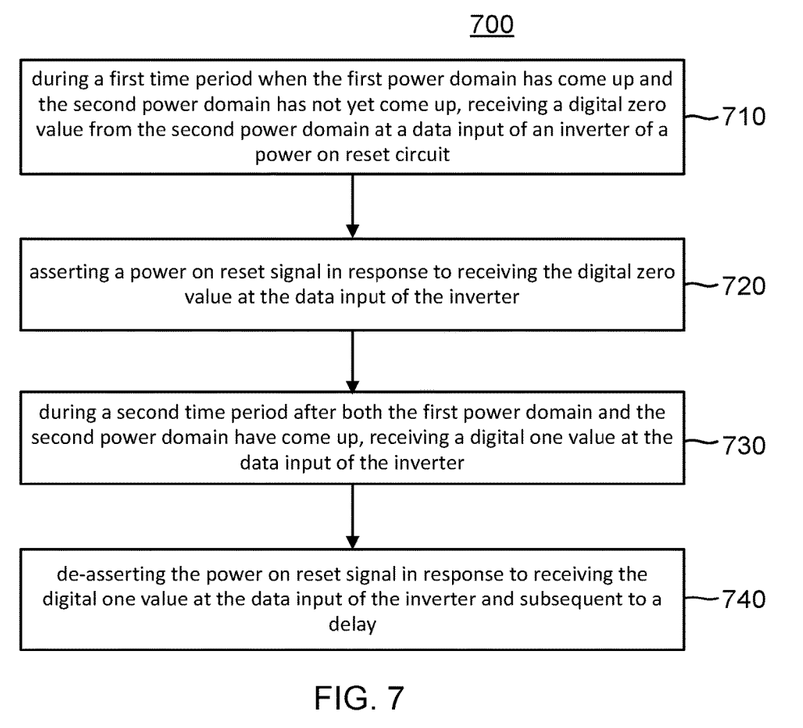
FIG. 7 is an illustration of an example method for providing a power on reset signal, according to one embodiment.

A flow diagram of an example method 700 for providing a power on reset signal is illustrated in FIG. 7. In one example, method 700 is performed by a processor device built on a semiconductor chip, such as a SOC or other device. An example is shown at FIG. 3, which includes two power on reset circuits 310 and 360. Each of the power on reset circuits includes an inverter powered by a first power domain (e.g., MX), and the inverter includes a data input coupled to a second power domain (e.g., PX). Each power on reset circuit also includes logic circuitry coupled with an output of the inverter and having a control signal output. For instance, in the example of FIG. 3, power on reset circuit 360 includes delay cells 363 and flip-flop 362, and power on reset circuit 310 includes flip-flops 311-313 and OR gate 314. In each of the power on reset circuits 310, 360, the logic circuitry is powered by the first power domain.

Continuing with the example, during a power up operation of the processor device, the first power domain powers up before the second power domain powers up. For each of the power on reset circuits 310 and 360, the inverter is configured to output a high signal to the logic circuitry upon power up of the first power domain and to output a low signal to the logic circuitry in response to power up of the second power domain. The logic circuitry receives the output of the inverter and outputs a first value for the control signal (e.g., a power on reset signal) in response to the first power domain powering up and outputs a second value (e.g., de-asserts the power on reset signal) for the control signal in response to the second power domain powering up and after a delay. In one example, the delay may be attributable to one or more delay cells, such as delay cells 363 of FIG. 3. In another example, the delay may be attributable to a series of sequential logic units, such as flip-flops 311-313, shifting a value from input to output according to a clock.

At action 710, a power on reset circuit receives a digital zero value from the second power domain at a data input of the inverter. For instance, when the second power domain has not yet come up, its power rail input to the power on reset circuit may be at 0V. This is during a first time period when the first power domain has come up and the second power domain has not yet come up. An example is shown at FIG. 3 for the power on reset circuits 310 and 360, where inverter 315 and 361 each receive a digital zero value at their respective data inputs from a power rail of the PX power domain. Of note at action 710 is that a power rail of the first power domain is at an operating voltage of that power domain, and the second power domain has a power rail that is at 0V (e.g., a digital zero value) rather than a floating value.

At action 720, the power on reset circuit asserts a power on reset signal in response to receiving the digital zero value at the data input of the inverter. In the example of power on reset circuit 310, the inverter 315 outputs a digital one, which either sets or resets the flip-flop 313 to cause a digital one value to be applied to an input of OR gate 314. The power on reset signal 356 is then applied to logic gates in mux controller 340. In the example of power on reset circuits 360 and 660, the inverter 361 outputs a digital one, which either sets or resets a flip-flop, thereby outputting a signal 351 that is used as a clamp control signal.

Eventually, the second power domain comes up, e.g., by reaching its normal operating voltage. At action 730, the logic circuitry of the power on reset circuit receives a digital one value at the data input of the inverter during a second time period after both the first power domain and the second power domain has come up.

For instance, in the example of power on reset circuit 310, inverter 315 receives a digital one value at its data input from power domain PX. Similarly, in the example of power on reset circuit 360, inverter 361 receives a digital one value at its data input from power domain PX. Such action starts the process that results in de-asserting the respective power on reset signals.

At action 740, the power on reset circuit de-asserts the power on reset signal in response to receiving the digital one value at the data input of the inverter. The de-assertion is subsequent to a delay.

In the example of FIG. 3, power on reset circuit 310 de-asserts the output signal 356 after the signal 355 at the OR gate 314 changes to a digital zero value. The digital zero value at the input to the OR gate 314 is subject to a delay that is attributable to shifting values through flip-flops 311-313 by clock signal 353. Of course, power on reset signal 356 may not be de-asserted immediately upon application of a digital zero at input 355 of OR gate 314. Rather, application of a zero by signal 355 to OR gate 314 does not necessarily change the value of signal 356; instead the zero at signal 355 allows signal 358 to control the output of OR gate 314. Thus, the change in value of signal 356 in the example of FIGS. 3 and 5 depends at least in part on the value of signal 358. In the example of power on reset circuits 360 and 660, the delay is attributable to delay cells 363.

The scope of embodiments is not limited to the actions shown in FIG. 7. Rather, other embodiments may add, omit, rearrange, or modify one or more of the actions. For instance, looking at the example power on reset circuit 360 of FIG. 3, asserting the power on reset signal may include applying the asserted power on reset signal to a plurality of clamps. Some of the clamps are configured to hold their respective clamp outputs to a first value (e.g., a digital one) in response to receiving the asserted power on reset signal. Others of the clamps are configured to hold the respective clamp outputs to a second value (e.g., digital zero) in response to receiving the asserted power on reset signal.

Once the power on reset signal is de-asserted, each of the clamps allows its respective clamp output to vary according to pass-through signals. Examples are shown in FIG. 3, where clamps 370 hold the values of signals 352-354 constant as long as signal 351 is asserted. However, once signal 351 is de-asserted, the various signals 352-354 may vary as designed in the application.

Looking at the example power on reset circuit 310 of FIG. 3, asserting the power on reset signal may include applying signal 356 to logic gates of the power mux control circuit 340. Furthermore, the example of FIG. 3 asserts the power on reset circuit by applying a digital one value for signal 355 at OR gate 314, which holds a steady value of signal 356 until signal 358 reaches a steady value after power up of the second power domain PX.

Of course, as noted above, other embodiments may use the signal 351 to set logic gates or may use power on reset signal 356 as a clamp control, as appropriate. Additionally, while FIG. 3 shows a portion of a processor chip having two power on reset circuits 310, 360 it is understood that the scope of embodiments includes any appropriate number of power on reset circuits in a given portion of a chip.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. Power on reset circuitry comprising:
   an inverter powered by a first power domain, the inverter including a data input coupled to a power rail of a second power domain;
   logic circuitry coupled with an output of the inverter, the logic circuitry having a control signal output; and
   wherein, during a power up operation, the first power domain powers up before the second power domain powers up, and wherein upon power up of the first power domain the inverter is configured to output a high signal to the logic circuitry and to output a low signal to the logic circuitry in response to power up of the second power domain, wherein the logic circuitry is configured to output a first value for a control signal in response to the first power domain powering up and configured to output a second value for the control signal in response to the second power domain powering up and after a delay, the power on reset circuitry further comprising:
   a first clamp in communication with the control signal output, the first clamp being configured to hold a first clamp output to the first value in response to receiving the control signal at the first value; and
   a second clamp in communication with the control signal output, the second clamp being configured to hold a second clamp output to the second value in response to receiving the control signal at the first value.

2. The power on reset circuitry of claim 1, wherein the first clamp is configured to let the first clamp output vary in response to receiving the control signal at the second value; and
   wherein the second clamp is configured to let the second clamp output vary in response to receiving the control signal at the second value.

3. The power on reset circuitry of claim 2, further comprising:
   a power multiplexor control circuit in communication with the second clamp.

4. The power on reset circuitry of claim 1, wherein the logic circuitry comprises a set-reset flip flop having either a set input or a reset input in communication with the output of the inverter, wherein an output of the set-reset flip flop controls a plurality of clamps.

5. The power on reset circuitry of claim 1, wherein the logic circuitry comprises:
   a first flip-flop receiving the output of the inverter; and
   an OR gate configured to receive an output of the first flip-flop.

6. The power on reset circuitry of claim 5, further comprising:
   a second flip-flop and a third flip-flop configured to shift a digital value to the first flip-flop in response to a clock signal.

7. The power on reset circuitry of claim 6, wherein the clock signal is generated in the second power domain.

8. The power on reset circuitry of claim 5, further comprising:
   a power multiplexor control circuit configured to receive the control signal from the OR gate.

9. The power on reset circuitry of claim 5, wherein the OR gate is further configured to receive a reset signal generated from the second power domain.

10. A method performed in a processing device having a first power domain and a second power domain, the method comprising:
    during a first time period when the first power domain has come up and the second power domain has not yet come up, receiving a digital zero value from a power rail of the second power domain at a data input of an inverter of a power on reset circuit, wherein the power on reset circuit is powered by the first power domain;
    asserting a power on reset signal in response to receiving the digital zero value at the data input of the inverter;
    during a second time period after both the first power domain and the second power domain have come up, receiving a digital one value at the data input of the inverter; and
    de-asserting the power on reset signal in response to receiving the digital one value at the data input of the inverter and subsequent to a delay, the method further comprising:
    receiving the power on reset signal during the first time period at a plurality of clamps; and
    clamping a plurality of input signal values by the plurality of clamps in response to assertion of the power on reset signal.

11. The method of claim 10, wherein the delay is defined by one or more delay cells disposed between an output of the inverter and a flip-flop of the power on reset circuit.

12. The method of claim 10, further comprising:
    passing the input signal values by the plurality of clamps in response to de-assertion of the power on reset signal.

13. The method of claim 10, wherein asserting the power on reset signal comprises forcing an output of a flip-flop by applying an output of the inverter to a first one of either a set input or a reset input of the flip-flop; and
    wherein de-asserting the power on reset signal comprises forcing the output of the flip-flop by applying the output of the inverter to a second one of either the set input or the reset inputs of the flip-flop via a delay cell.

14. The method of claim 10, wherein asserting the power on reset signal comprises:
    forcing an output of a first flip-flop by applying an output of the inverter to the first flip-flop and applying a digital one value to a first input of an OR gate in response to forcing the output of the first flip-flop.

15. The method of claim 14, wherein de-asserting the power on reset signal comprises:
forcing the output of the first flip-flop by shifting a digital one value through a second flip-flop, wherein the digital one value is shifted through the second flip-flop by a clock generated from the second power domain, and wherein the digital one value is generated from the second power domain.

16. The method of claim 15, wherein de-asserting the power on reset signal comprises:
applying a digital zero value to the first input of the OR gate in response to shifting the digital one value to the second flip-flop.

17. The method of claim 14, further comprising:
applying a reset signal to a second input of the OR gate, wherein the reset signal is generated by the second power domain.

18. A power on reset circuit comprising:
an inverter configured to receive power from a first power domain and coupled at a data input to a power rail of a second power domain;
means for receiving an output from the inverter and applying a digital one value to a first input of an OR gate in response to receiving the output from the inverter;
means for receiving a digital value from the second power domain and shifting the digital value according to a clock from the second power domain to apply a digital zero to the first input of the OR gate; and
means for applying a reset signal from the second power domain to the second input of the OR gate.

19. The power on reset circuit of claim 18, wherein the means for receiving the digital value comprises a plurality of flip-flops.

20. A power on reset circuit comprising:
an inverter configured to receive power from a first power domain and coupled at a data input to a power rail of a second power domain;
means for receiving an output from the inverter at a first one of either a set input or a reset input and asserting a power on reset signal to a plurality of clamps in response to receiving the output from the inverter; and
means for applying a delay to the output of the inverter, wherein the means for applying delay is coupled between the output of the inverter and a second one of either the set input or the reset input.

21. The power on reset circuit of claim 20, wherein the means for receiving the output from the inverter comprises a flip-flop.

* * * * *